(12) United States Patent
Jun et al.

(10) Patent No.: US 7,536,617 B2
(45) Date of Patent: May 19, 2009

(54) PROGRAMMABLE IN-SITU DELAY FAULT TEST CLOCK GENERATOR

(75) Inventors: Hong-Shin Jun, San Jose, CA (US); Sung Soo Chung, San Jose, CA (US); Heong Kim, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 364 days.

(21) Appl. No.: 11/103,877

(22) Filed: Apr. 12, 2005

(65) Prior Publication Data
US 2006/0242474 A1    Oct. 26, 2006

(51) Int. Cl.
G01R 31/28    (2006.01)

(52) U.S. Cl. ............... 714/731; 327/158; 327/141; 327/116

(58) Field of Classification Search ............... 714/731
See application file for complete search history.

(56) References Cited

U.S. PATENT DOCUMENTS 5,617,426 A * 4/1997 Koenemann et al. ........ 714/726
6,031,401 A   2/2000 Dasgupta
6,650,575 B1  11/2003 Khanna
6,690,219 B2 * 2/2004 Chuang ................ 327/176
6,847,241 B1 * 1/2005 Nguyen et al. ........... 327/158
6,909,311 B2 * 6/2005 Foley et al. ............ 327/141

OTHER PUBLICATIONS

IEEE Std 1149.1-2001. IEEE Standard Test Access Port and Boundary-Scan Architecture.*

* cited by examiner

*Primary Examiner*—Cynthia Britt
*Assistant Examiner*—Steve Nguyen
(74) *Attorney, Agent, or Firm*—Trellis IP Law group, PC

(57) ABSTRACT

A system and method for programmable in-situ launch and capture clock generation is provided. The system provides an efficient and improved manner for delay and signal transition fault testing in electronic circuits. The system comprises i) an in-situ delay clock generator for generating one or more clocks; ii) a pulse Programmable Selection Generator (PSG) which can be either a pulse PSG and/or an expanded pulse PSG for generating the sequence in which the clocks are to be selected, the clocks being selected with a delay; and iii) a multiplexer for selecting the plurality of clocks, based on the generated sequence, the selected clocks being used for generating the launch and capture clocks.

17 Claims, 12 Drawing Sheets

PROGRAMMABLE IN-SITU DELAY FAULT TEST CLOCK GENERATOR

BACKGROUND OF THE INVENTION

1. Field of Invention

Embodiments of the present invention relate to fault testing in electronic circuits. More particularly, the embodiments of the present invention relate to programmable in-situ launch and capture clock generation for at-speed testing.

2. Description of the Background Art

Investigating faults in semiconductor devices is a critical aspect of the manufacturing and maintenance process. As the geometries of semiconductor devices are getting smaller, failures caused by defects in the manufacturing process and design margins are becoming increasingly common. Exemplary failures include those caused by timing-related at-speed faults.

Conventional methods of fault testing, such as stuck-at fault models, etc., are no longer an effective solution. A better method is at-speed testing, i.e., testing the device at its working frequency. At-speed testing is based on a transition fault model and/or a path delay fault model. These models require a device tester to launch the test pattern and capture the response of the device at the operating speed. The functional mode of the at-speed device tester produces two pulses known as a launch clock and a capture clocks. At-speed testing depends on these two clocks to detect at-speed-related defects.

However, maintaining the accuracy of these clocks at higher clock speeds is very costly and difficult. Most often, the device tester's at-speed frequency performance does not scale up with the increasing speed of the device's internal operating frequency. To combat this problem, existing test generation tools use on-chip high-speed test clocks. This is also known as in-situ test clock generation. However, existing test clock generation techniques are not applicable across different technologies, since it is difficult to scale the delay of the clock according to the device requirement. This reduces the accuracy of testing these devices. Moreover, these techniques do not address critical path delay measurement.

DETAILED DESCRIPTION OF EMBODIMENTS OF THE INVENTION

Figure 1:
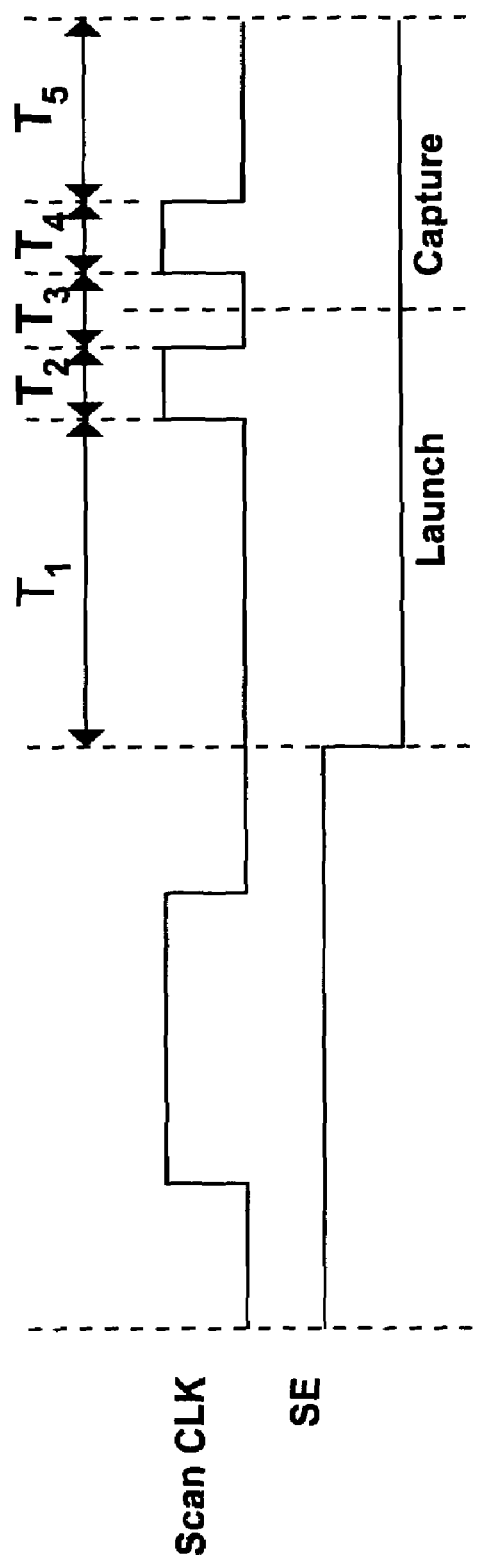
FIG. 1 illustrates an exemplary launch and capture clock cycle for at-speed testing, according to an exemplary embodiment of the invention.

Various embodiments of the invention provide a system and method for in-situ launch and capture clock generation. In-situ capture and launch clocks are used to test, diagnose and analyze defects in electronic circuits such as semiconductor devices. They also eliminate external tester dependency. The clocks can be used for testing path delay faults and transition faults at any stage of device production and characterization. The embodiments of the invention can be applied across different technologies, starting from a wafer probe station to a system environment, and therefore, have wide applicability.

In an exemplary embodiment of the invention, a system for generating a launch and capture clock is provided. The system includes i) an in-situ delayed clock generator for generating one or more clocks; ii) a pulse Programmable Selection Generator (PSG) for generating the sequence in which the clocks are to be selected, the clocks being selected with a delay; and iii) a multiplexer for selecting the plurality of clocks, based on the generated sequence, the selected clocks being used for generating the launch and capture clocks.

In another exemplary embodiment of the invention, a method for generating a launch and capture clock is provided. The method includes i) generating one or more clocks with delay, with respect to a system clock; ii) generating a sequence in which the clocks are to be selected with a delay; and iii) selecting the plurality of clocks, based on the selected sequence for generating the launch and capture clocks.

In another exemplary embodiment of the invention, a method for in-situ launch and capture clock generation for semiconductor device testing is provided. The method includes i) generating one or more clocks with delay with respect to a system clock; ii) selecting the sequence of the delay clocks, based on pre-programmed values for pulse selection; iii) selecting the plurality of clocks, based on the selected sequence for generating launch and capture clocks; and iv) adding extra wait time before a launch pulse and after a capture pulse for at least one of the clock cycles generated by the selected clocks.

In yet another exemplary embodiment of the invention, a machine-readable medium with instructions for in-situ launch and capture clock generation for at-speed testing, to detect faults in semiconductors devices, is provided. The medium includes i) one or more instructions for generating one or more clocks with delay, with respect to a system clock; ii) one or more instructions for selecting the sequence of the delay clock, based on pre-programmed values for pulse selection; iii) one or more instructions for selecting one of the plurality of clocks, based on the selected sequence for generating a launch and capture clock; and iv) one or more instructions for adding extra wait time before the launch pulse and after the capture pulse for the multiple clock cycles.

Particular embodiments include a machine readable storage medium including instructions for generating a launch and capture clock signal for at-speed testing to detect faults in semiconductors devices. Also, particular embodiments include an apparatus for generating a launch and capture clock signal, the apparatus comprising a processing system including a processor coupled to a display and user input device and a machine readable storage medium including instructions for generating a launch and capture clock signal for at-speed testing to detect faults in semiconductors devices.

FIG. 1 illustrates exemplary launch and capture clock cycles for at-speed testing, with timing parameters $T_1$, $T_2$, $T_3$, $T_4$ and $T_5$ for the launch and capture clock. These timing parameters are utilized during the delay and transition fault tests. As shown in the figure, the launch and capture clock is active after a Scan Enable (SE) signal goes from '1' to '0'.

In various embodiments of the invention, the launch and capture clock is generated by using programmable in-situ delay fault test clocks. The first step in programmable in-situ delay fault test clock generation is producing delay clocks. The edges of the clock cycles corresponding to the delay clocks generated are used as the edges of launch and capture clocks. In an exemplary embodiment of the invention, buffers are used to generate clocks with delay. If 'n' is the number of buffers used and 'd' the unit delay for each of the 'n' buffers used, the delay introduced is according to the following relationship.

$$(n*d) < (T_{SCLK}/2)$$

Here, (n*d) is the maximum delay edge generated from the unit delay, and $T_{SCLK}$ is the time corresponding to a system clock. The unit delay timing resolution is used as the minimum test resolution. With the use of a unit delay for delay clock generation, the timing resolution can be scaled, i.e., different delays can be used where different resolutions are required for different delay ranges. In an exemplary embodiment of the invention, buffers with different delays can be mixed, or a combination of buffers can be used to generate different delay elements.

Figure 2:
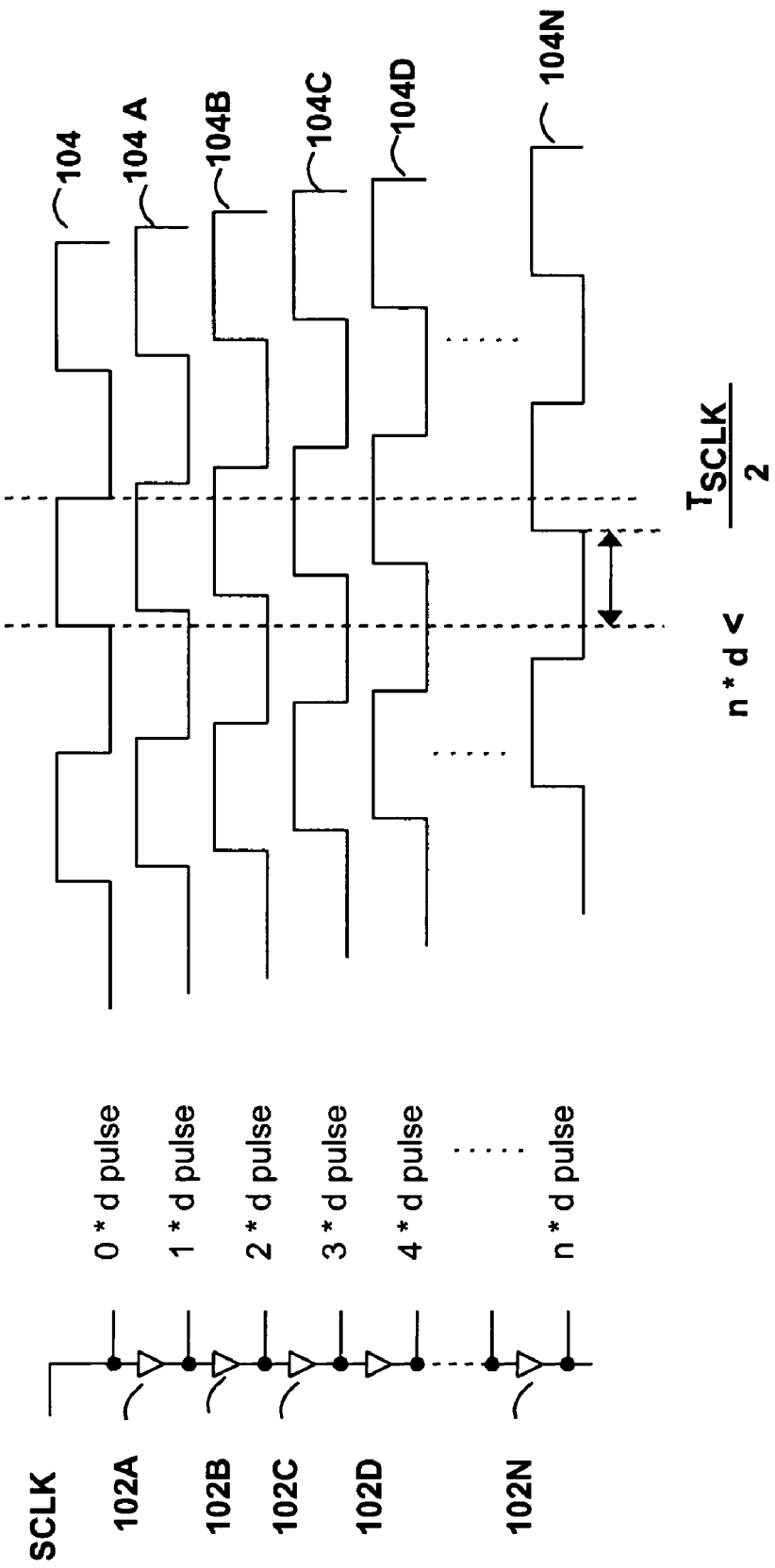
FIG. 2 illustrates the clock cycles corresponding to the plurality of clocks generated by a unit delay, according to an exemplary embodiment of the invention.

FIG. 2 illustrates waveforms representing the plurality of delay clocks generated with different multiples of unit delay. The delay clocks are generated by using 'n' buffers with delay 'd'. As shown in FIG. 2, buffers 102 A, 102 B ... 102N are used with a unit delay 'd'. Waveform 104 depicts clock cycles for a clock when no buffer has been introduced. Waveform 104A depicts clock cycles for the clock delayed by buffer 102 A, with a delay (1*d). Similarly, waveforms 104 B, 104 C, 104 D represent the clock cycles corresponding to the clocks delayed by buffer 102 B, 102 C, 102 D, with delay (2*d), (3*d), and (4*d), respectively. Similarly, waveform 104 N represents clock cycles corresponding to the clocks delayed by buffer 102 N, with a delay (n*d). As described in conjunction with FIG. 1, the delay introduced follows the relationship $(n*d) < (T_{SCLK}/2)$.

Figure 3:
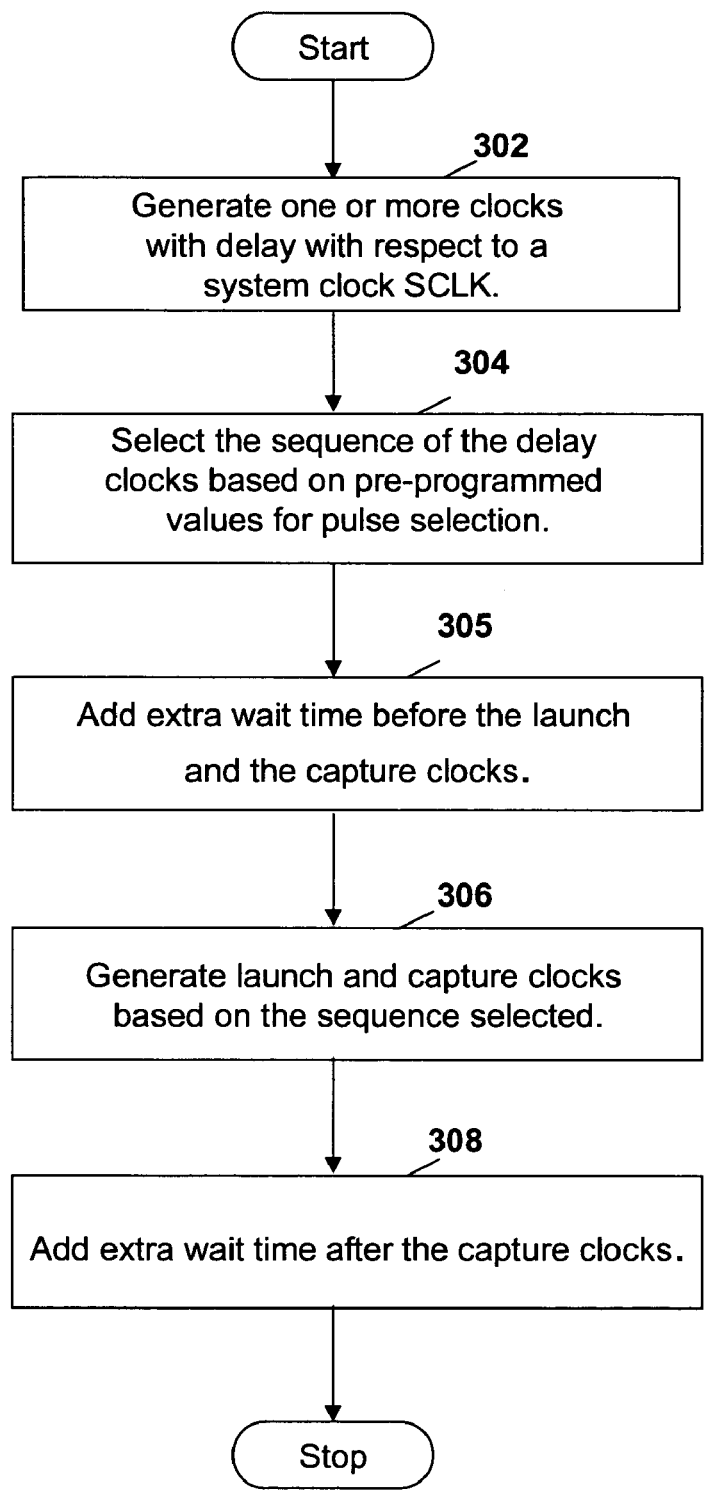
FIG. 3 is a flowchart illustrating the method steps involved in launch and capture clock generation, according to an exemplary embodiment of the invention.

FIG. 3 is a flowchart illustrating the method steps involved in the launch and capture clock generation, according to an exemplary embodiment of the invention. The method starts at step 302 with the generation of one or more clocks with delay, with respect to a system clock referred to as SCLK. The next step 304 includes selecting a sequence of delay clocks, based on pre-programmed values for pulse selection. According to an exemplary embodiment of the invention, the values for pulse selection can be programmed by a Boundary Scan method also known as Joint Test Action Group (JTAG). In another embodiment of the invention, the input pins directly can program the values with test mode control pins. Those pins can be shared with functional pins. In yet another embodiment of the invention, the values for pulse selection can also, be programmed by the registers that can be controlled by diagnostics software or system access. Extra time is generated before the launch and the capture clocks at step 305. Finally, the launch and capture clocks can be generated by using the selected sequence at step 306. In an embodiment of the invention, extra wait time can be added after a capture clock, for the clock cycles generated, at step 308. In the above method, steps can be implemented into a system according to various embodiments of the invention as described herein after.

Figure 4A:
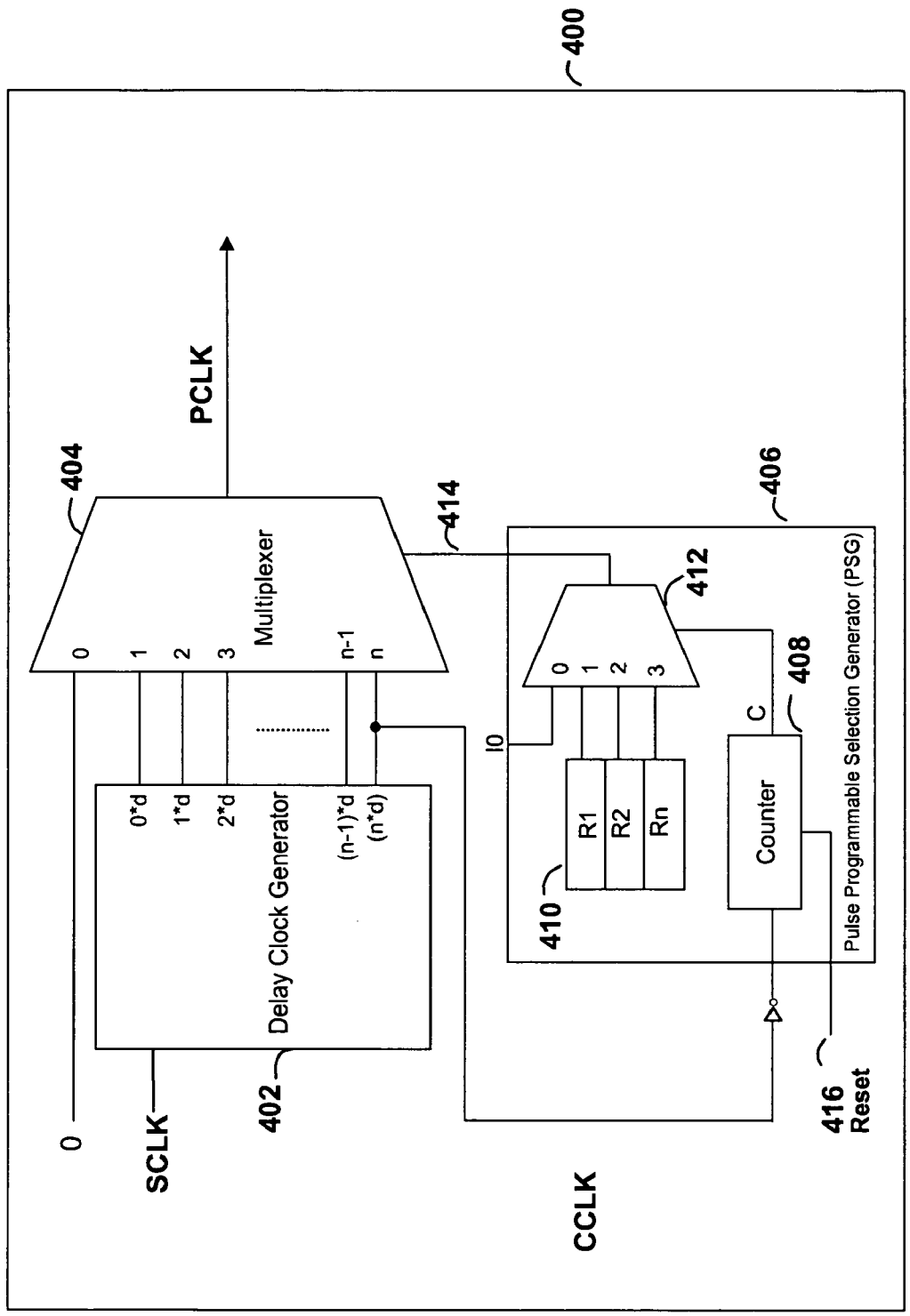
FIG. 4A illustrates a functional block diagram of a test clock generator for the generation of the launch and capture clocks, according to an exemplary embodiment of the invention.

FIG. 4A illustrates a functional block diagram of a test clock generator (TCG) 400, for the generation of a launch and capture clocks, according to an exemplary embodiment of the invention. TCG 400 consists of a delay clock generator 402, a multiplexer 404, and a pulse Programmable Selection Generator (PSG) 406. Pulse PSG 406 further includes a counter 408, a storage unit 410, a multiplexer 412, and a reset 416. Storage unit 410 includes a plurality of registers, each register storing a pulse selection value. For example, R1 is the pulse selection value stored in a first register. Similarly, there can be 'n' registers, each corresponding to a pulse selection value. In various embodiments of the invention, the number of registers corresponds to the number of the launch and capture pulse. In an exemplary embodiment of the invention, the registers of pulse PSG 406 store the pulse selection values programmed by a Boundary Scan method.

In various embodiments of the invention, the system elements of TCG 400 can be implemented in the form of integrated circuits, flip flops, application-specific integrated circuit, system-on-chip, and their combination thereof.

According to an exemplary embodiment of the invention, TCG 400 works by generating plurality of clocks, each with multiples of a unit delay, by delay clock generator 402. There can be zero to 'n' number of clocks generated with a delay 'd' with respect to the system clock SCLK. An exemplary method for generating the delay clocks has been described in conjunction with FIG. 2. In an embodiment of the invention, Pulse PSG 406 takes one of the delay clocks generated from delay clock generator 402 as an input to generate a pulse selection sequence. The clock signal corresponding to this input delay clock is referred to as counter clock CCLK. Counter 408 counts this clock signal. In an embodiment of the invention, the counter can be incremental. In another embodiment of the invention, the counter can be decremental. Counter 408 may also be reset via reset 416 to a pre-determined value. In an embodiment of the invention, reset 416 is a synchronous reset. When the reset is high, the output of counter 408 is 0. If the reset goes low, counter 408 starts up, counting to generate C at the falling edge of CCLK.

The output signal generated by counter 408 is used as a control signal for multiplexer 412. Based on this control signal, multiplexer 412 selects one of the stored values of pulse selection from the registers (R1, R2 ... Rn) as an output signal 414. This output signal denotes the sequence in which the delay clocks are to be selected by multiplexer 404, to finally produce the launch and capture clocks, referred to as PCLK. This launch and capture clock is used for at-speed testing of electronic circuits. In various embodiments of the invention, PCLK is problem-free because the delayed clocks do not change at the falling edge of CCLK. In an embodiment of the invention, multiplexer 404 has a setup time requirement on PS at the rising edge of SCLK. Its margin is $(T_{CLK}/2) - (n*d) - \text{DELAY}_{CCLK \to PS}$.

Figure 4B:
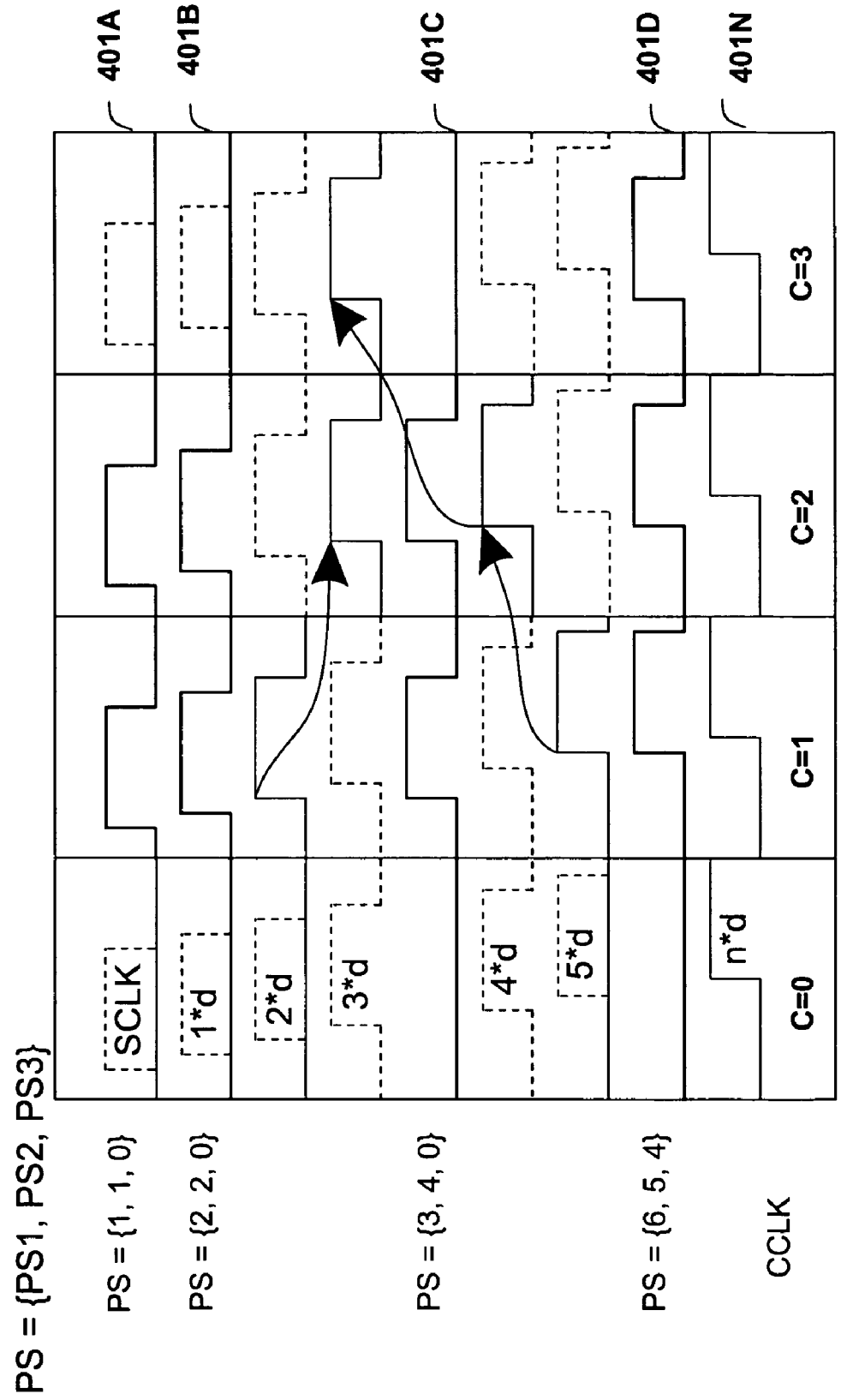
FIG. 4B illustrates the waveforms corresponding to exemplary values for pulse selection, illustrated in FIG. 4A, according to an exemplary embodiment of the invention.

FIG. 4B illustrates the waveforms corresponding to exemplary values for pulse selection, according to an exemplary embodiment of the invention. PS denotes the pulse selection values. 401A, 401B, 401C and 401N represent various waveforms generated by the pulse selection method corresponding to exemplary pulse selection values. The dotted lines represent SCLK and the delayed clocks. PS1, PS2 and PS3 are the pulse selection values stored in the registers R1, R2 and R3, respectively. The registers mentioned are stored in storing unit 410.

In an exemplary embodiment of the invention, the pulse selection value PS={1, 1, 0}, i.e., PS1=1, PS2=1, and PS3=0. These pulse selection values are taken as an input by multiplexer 412 to produce the waveform represented by 401A. In 401A, PCLK stays low during the first cycle, i.e., C=0. PCLK toggles during the second and third cycles, and stays low during the forth cycle. Similarly, 401B represents the waveform corresponding to pulse selection value PS={2, 2, 0}. PCLK toggles according to (1*d) the delay clock. In both the cases, the delay between the launch and capture clock stays the same as SCLK, i.e., the time period of the delay clock. Waveform 401C represents the pulse selection value PS={3, 4, 0}, where the first pulse is from (2*d) the delay clock and the second pulse is from (1*d) the delay clock. In this case, the delay between the two rising edges of PCLK is shorter than that of SCLK by 'd'. Similarly, higher speed clock can be also produced for values of pulse selection such as PS={6, 5, 4}.

Figure 5A:
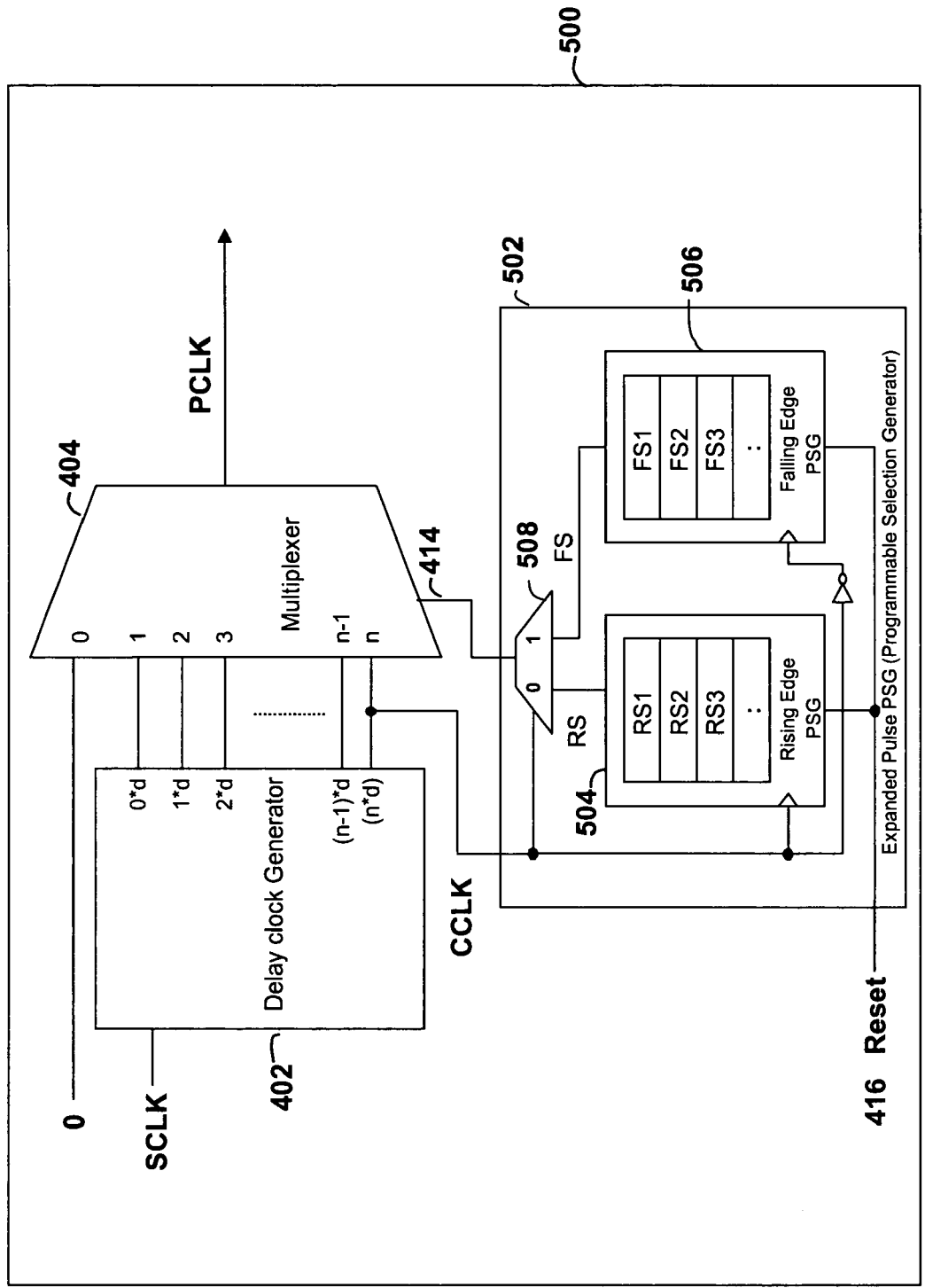
FIG. 5A a functional block diagram for edge selection, according to an exemplary embodiment of the invention

In an embodiment of the invention, an expanded pulse PSG is provided for adjusting any amount of delay at the edges of the delay clocks. According to an exemplary embodiment, a pulse PSG 406 can be an expanded pulse PSG 502. FIG. 5A illustrates a functional block diagram 500 for edge selection. According to an exemplary embodiment of the invention, expanded pulse PSG 502 includes a rising edge PSG 504, a falling edge PSG 506, and an edge selection multiplexer 508. Rising edge PSG 504 includes a plurality of registers (RS1, RS2 ... RSn), each referring to a pre-programmed value for generating a rising edge selection signal. Similarly, falling edge PSG 506 includes a plurality of registers (FS1, FS2 ... FSn), for storing a pre-programmed value to generate a falling edge selection signal. A rising edge represents a logical 0 to 1, and a falling edge represents a logical 1 to 0. Rising edge PSG 504 operates at the rising edge of the CCLK, and falling edge PSG 506 operates at the falling edge of the CCLK. This ensures a half-timing margin on edge selection multiplexer 508 when it is selecting the rising edge or the falling edge, based on the level of the CCLK. According to an exemplary embodiment of the invention, edge selection multiplexer 508 selects a rising edge of the plurality of delay clocks when the CCLK is low, and selects a falling edge of the plurality of delay clocks when the CCLK is high. The selected signal is taken as an input for multiplexer 404, to produce the launch and capture clocks.

Figure 5B:
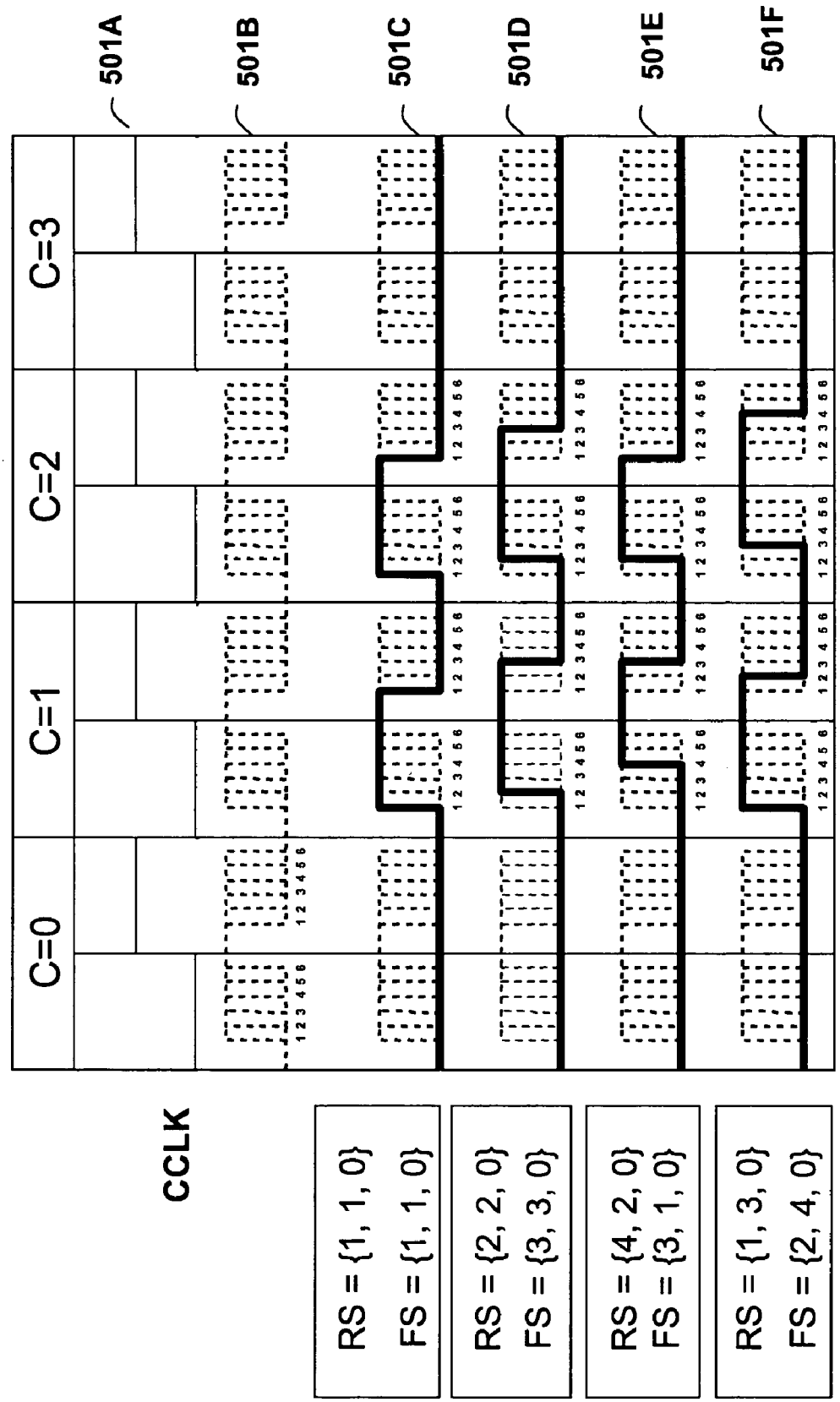
FIG. 5B illustrates the waveforms corresponding to exemplary values for edge selection, according to an exemplary embodiment of the invention.

FIG. 5B illustrates the waveforms corresponding to exemplary values for edge selection, according to an exemplary embodiment of the invention. 501A represents the counter clock CCLK, taken as input for edge selection by programmable edge selection generator 502. The delay clocks are represented by dotted lines. The edges of the delay clocks are used for edge selection. 501C, 501D, 501E and 501F represent various waveforms generated by the edge selection method, corresponding to exemplary edge selection values. RS represents rising edge selection and FS falling edge selection. RS1, RS2 and RS3 represent pre-programmed values for rising edge selection, stored in rising edge PSG 504; and FS1, FS2 and FS3 represent pre-programmed values for falling edge selection, stored in falling edge PSG 506.

Waveform 501C shows the output of the PCLK when RS={1, 1, 0} and FS={1, 1, 0}. In C=1 cycle, edge selection multiplexer 508 takes the rising edge of SCLK as RS1=1, and the falling edge of SCLK as FS1=1. The C=2 cycle also follows SCLK because RS2=1 and FS2=1. Similarly, waveform 501D, when RS={2, 2, 0} and FS={3, 3, 0} are in the cycle of C=1 and take the rising edge of the '1*d' delayed clock and the falling edge of the 2*d delayed clock is selected. So, $T_2$ becomes $(T_{SCLK}/2)+1*d$. The value of the timing parameter (as mentioned in FIG. 1) $T_2$ can be calculated from $(T_{SCLK}/2)+(FS1-RS1) * d=(T_{SCLK}/2)+(3-2) * d$. $T_3$ and $T_4$ can be calculated by FS1, RS2 and FS2 in the same way. Similarly, for waveform 501E, when RS={4, 2, 0} and FS={3, 1, 0}, faster PCLK can be generated with a 50 percent duty cycle. Also, RS={1, 3, 0} and FS={2, 4, 0} produces slower PCLK with a 50 percent duty cycle.

Figure 5C:
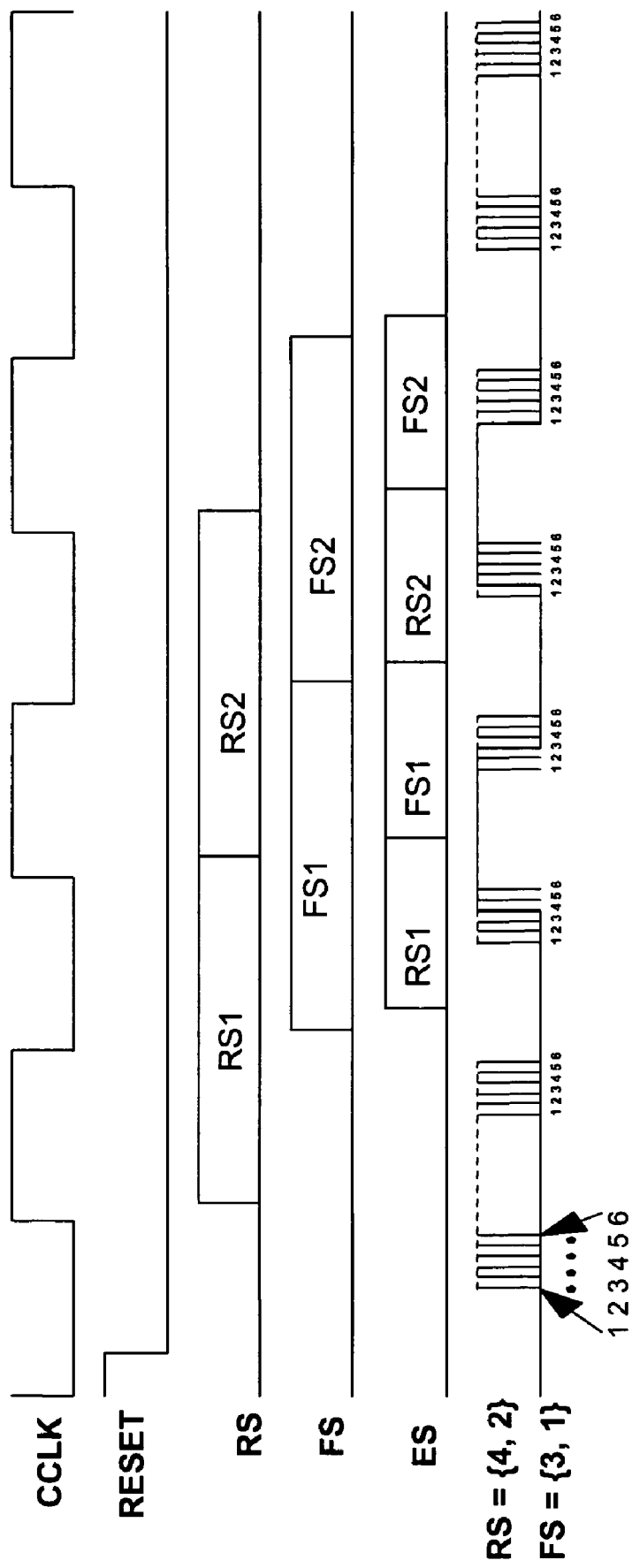
FIG. 5C represents the timing of the internal signal, reset, RS, FS and ES, according to an exemplary embodiment of the invention.

FIG. 5C represents the timing of the CCLK signal, the reset signal, RS, FS and ES, in an exemplary embodiment of the invention. In various embodiments of the invention, the reset signal can be released after a falling edge of CCLK signal and before the setup time of the next rising edge. This ensures correct sequencing of ES, starting from RS1.

According to an exemplary embodiment of the invention, TCG 400 further includes a system element for adding multiple wait cycles. The scan enable (SE) signal used during the internal scan test may be slow for at-speed testing. After switching the SE signal from high to low TCG 400 may need to wait multiple system clock cycles before the launch clock can occur. This provides sufficient time for the scan enable signal to propagate all internal scan flip-flops.

Figure 6A:
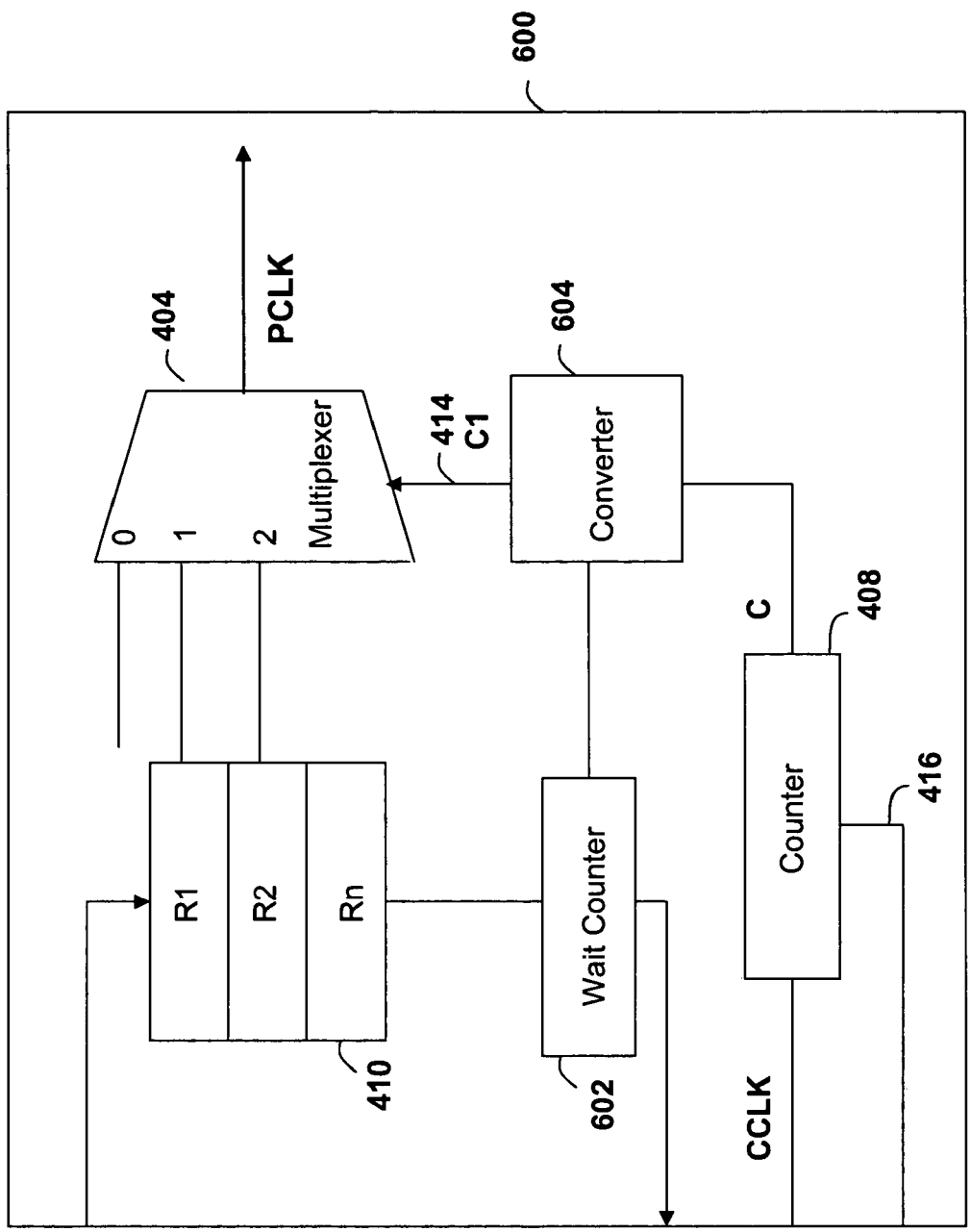
FIG. 6A is a functional block diagram depicting the addition of multiple wait cycles in the test clock generator.

FIG. 6A is a functional block diagram of a system 600 for adding multiple wait cycles. System 600 includes a wait cycle counter 602 and a converter module 604. Wait counter 602 counts the number of multiple system clock cycles to wait before initiating the launch clock. In an embodiment of the invention, this number is a predefined value. Converter module 604 converts the output of counter 408 to zero until the number of wait cycles is achieved. The output of counter 408 is denoted by C and the output of the converter module is denoted by C1.

Figure 6B:
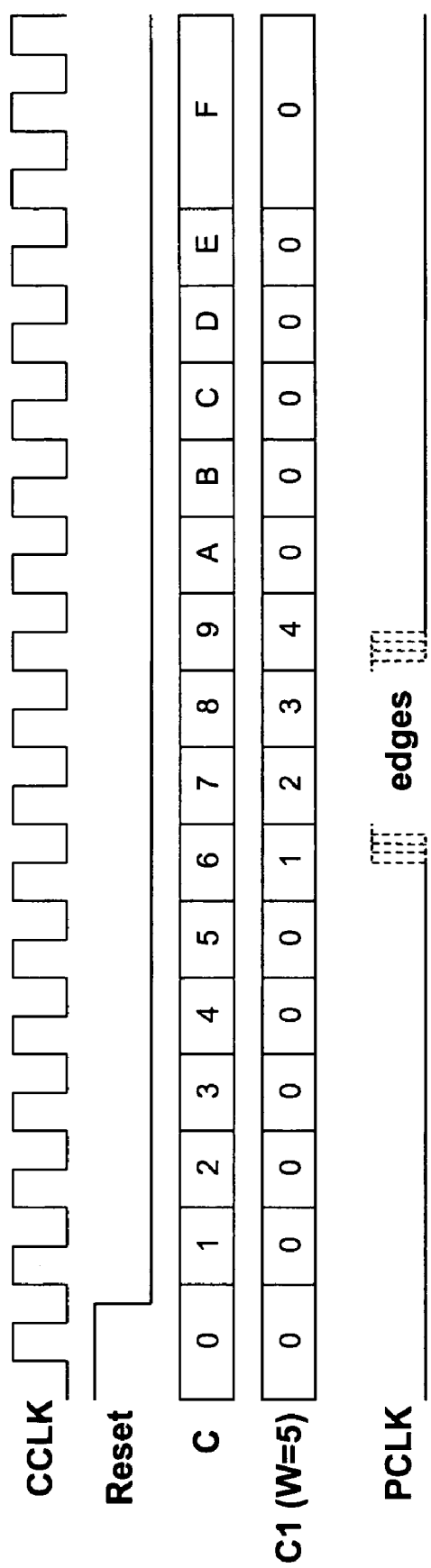
FIG. 6B depicts exemplary output results for adding multiple wait cycles to the test clock generator depicted in FIG. 6A.

FIG. 6B depicts exemplary output results for adding multiple wait cycles to the test clock generator. Wait cycle counter 602 counts a total of five cycles before initiating the launch clock. Converter module 604 converts the output of counter 408 to zero until wait cycle counter 602 counts five wait cycles. Then converter module 604 stays at zero until a specified number of selection registers is met. The output values for the counter 408 are represented against C and the corresponding output values for the converter module 604 are represented by C1 in accordance with the FIG. 6B. The number of selection registers in this exemplary case is considered as four. The PCLK toggles based on the programmed value in the selection registers after five wait cycles.

To summarize, various embodiments of the invention provide systems and methods for in-situ launch and capture clock generation. The Programmable In-Situ Delay TCG can perform path delay and signal transition fault testing and can measure speed-related AC characteristics and parameters at any stage of device production and operation. As depicted in the various embodiments of the invention, no external tester is required. The accuracy of the process is also very high. Low-scan testers are used, and therefore, the cost can be controlled. Timing accuracy can scale with device (silicon) technology by using the given technology's unit delay as a base measurement unit. The test clock generator (TCG) of the various embodiments of the invention can be adapted to any application-specific integrated circuit (ASIC), and therefore has wide applicability Moreover, no added ASIC design for test (DFT) design and overhead verification is required, since existing internal-scan test protocols and infrastructures are used. Further, no added functional delay penalty is required. The TCG can be applicable for the multiplexer-based scan (known as mux scan) as well as level-sensitive scan design LSSD-based scan techniques. The embodiments of the invention provide accurate timing measurement and characterization methodology for 90 nm and next generation ASIC delay test solution.

Further, the size of TCG 400 is smaller than conventional TCGs. For example, in the case of a 500 MHz clock, 16 delay taps, up to 4 pulses (1 launch+3 captures):
 Pulse Selection (rising edge only): 1200 gate counts
 Edge Selection (rising/falling edges): 2500 gate counts These gate counts are significantly smaller than corresponding conventional systems.

Other exemplary applications with TCGs include creating a Shmoo plot of critical path timing characteristics with unit delay. Failure analysis and device AC characterization for Vt shift and Negative bias temperature instability (NBTI) effects can also be measured.

Figure 7:
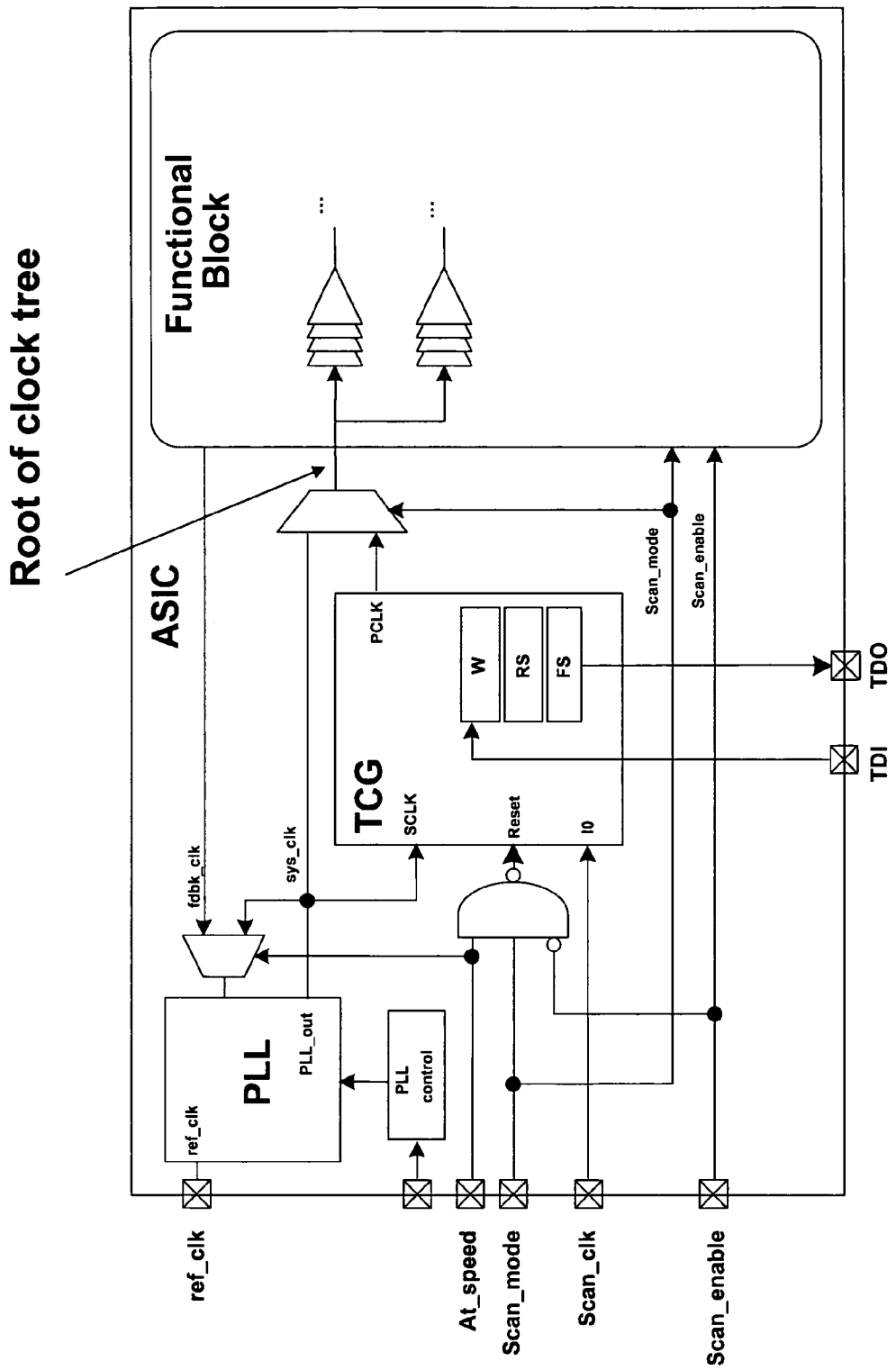
FIG. 7 depicts an exemplary internal scan design circuit to which the Test Cycle Generator (TCG) can be applied.

FIG. 7 depicts an example of the application of TCG 400 to the internal scan design. Table 1 depicts the input values of TCG 400. Three working modes are generated by a combination of scan mode and at-speed mode. The working modes are known as a functional mode, a slow scan mode and an at-speed mode. These working modes are mentioned in column 3. The corresponding values of the shift clock and capture clocks are mentioned in column 4 and column 5, respectively. These values can be used in the internal scan design model incorporating the TCG.

| Scan_mode | At_speed | Mode | Shift clock (Scan_enable=0) | Capture clock (Scan_enable=1) |
|---|---|---|---|---|
| 0 | 0 | Functional mode | — | — |
| 0 | 1 | Not used | — | — |
| 1 | 0 | Slow scan mode | Scan_clk (TCG.Reset=1) | Scan_clk (TCG.Reset=1) |
| 1 | 1 | At-speed scan mode | Scan_clk (TCG.Reset=1) | PCLK (TCG.Reset=0) |

Detailed working: The TCG can be placed between a Phased Lock Loop (PLL) and the root of the clock tree in the top level. Root of the clock tree is the starting point for the clock tree synthesis. During the functional operational, the system clock from PLL is selected to drive the clock tree. In the slow scan mode, the primary input, Scan_clk, is driving the clock tree for shifting as well as capturing. TCG 400 bypasses the I/O input to PCLK when its reset is high. During the at-speed scan, Scan_clk is selected for the shift clock and PCLK is selected for the at-speed capture clock. The PLL takes the feedback clock directly from PLL_out, so that it stays locked with the reference clock when the slow-speed shift clock is driving the clock tree. The Scan_clk and Scan_enable signals are driven from an Automatic Test Equipment (ATE). TCG 400 generates PCLK, based on the programmed values in the registers, W, RS, and FS. JTAG UDRs (user-defined registers) are used for the programmable registers in this example. The PLL needs to be set up properly and running before the at-speed scan testing.

Figure 8:
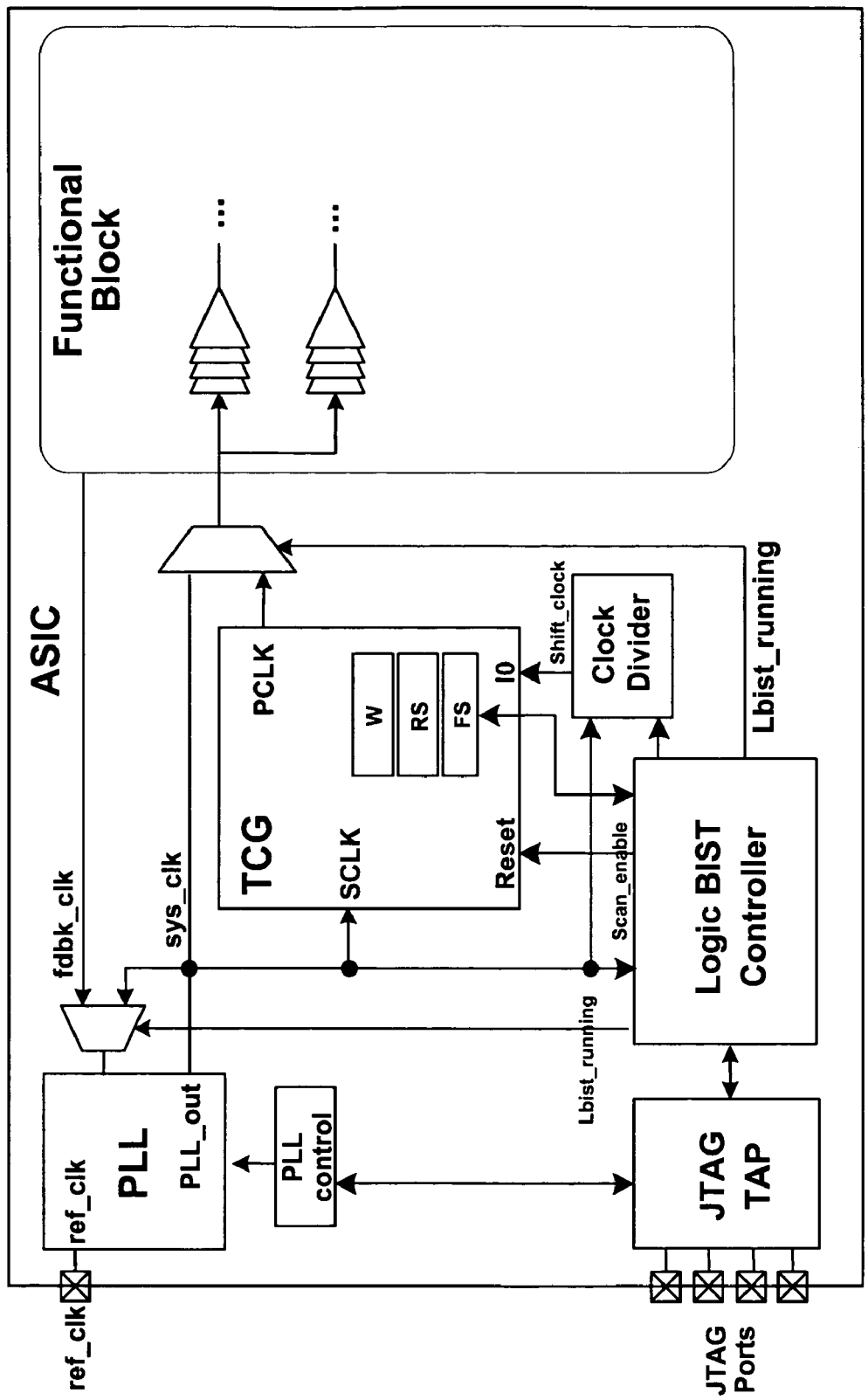
FIG. 8 shows an example of a Logic Built-in Self Test (BIST), wherein the TCG can be applied.

FIG. 8 shows an example of the application of TCG 400 to the Logic Built-in Self Test (BIST). TCG 400 can be placed between a PLL and the root of clock tree in the top level. The logic BIST controller the controls Scan_enable signal. A clock divider is used for generating a Shift clock. JTAG TAP is controlling the Logic BIST controller and the PLL.

During the functional operation (1bist_running=0), the PLL_out from PLL drives the clock tree. During the at-speed Logic BIST operation (1bist_running=1), PCLK is used to drive the clock tree. The shift_clock from the clock divider is used for scan shift operations. When scan_enable is low, the PCLK is fed into the clock tree. The logic BIST controller sets the timing parameters, W, RS, and FS. The PLL control setup is carried out through the JTAG interface.

Although the invention has been discussed with respect to specific embodiments thereof, these embodiments are merely illustrative, and not restrictive, of the invention.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A system for generating a launch and capture clock signal, the system comprising
   a delay clock generator for generating one or more clock signals with delay with respect to a system clock, the one or more clock signals including pulses at different units of delay with respect to the system clock;
   a pulse Programmable Selection Generator (PSG) including programmed signal values associated with the one or more clock signals that are used to denote different sequences in which the one or more clock signals are to be selected to generate different delay between a launch pulse and a capture pulse in different launch and capture clock signals, the PSG configured to receive an input clock signal and use the input clock signal as a control signal to generate a pulse selection sequence of signal values denoting a sequence in which clock signals in the one or more clock signals are to be selected over a plurality of clock cycles, the one or more clock signals being selected with a delay to create the launch pulse and the capture pulse where the launch pulse and the capture pulse change at an edge delayed from an edge of the input clock signal; and
   a multiplexer for generating a launch and capture clock signal based on the pulse selection sequence of signal values, the signal values identifying the clock signals over the plurality of clock cycles to create the launch pulse for a launch clock signal and the capture pulse for a capture clock signal in the launch and capture clock signal, wherein the system for generating the launch and capture clock signal is used for testing a device in which the system is located in-situ, wherein the pulse PSG further comprises:
   a counter receiving the input clock signal from one of the one or more clock signals;
   a plurality of registers having pre-programmed values for pulse selection; and
   a multiplexer, which takes as input the pre-programmed values from the plurality of registers and a control signal from the counter to generate the signal value denoting the sequence of selection for the one or more clock signals.

2. The system of claim 1, wherein the counter further comprises a synchronous reset to reset the values of the counter.

3. The system of claim 1, wherein the pulse PSG further comprises an expanded PSG for adjusting any amount of delay on edges of a clock cycle for each of the one or more clock signals.

4. The system of claim 3, wherein the expanded pulse PSG further comprising
   a rising edge PSG for adjusting the delay at a rising edge of a clock signal in the one or more clock signals; and
   a falling edge PSG for selecting the delay at a falling edge of the clock signal in the one or more clock signals.

5. The system of claim 1, further comprising means for adding one or more wait cycles before a launch pulse or after a capture pulse in the launch and capture clock signal.

6. The system of claim 5, wherein the means for adding one or more wait cycles comprises
   a wait cycle counter for counting a number of wait cycles; and
   a converter module to convert a wait cycle counter output to zero until the number of wait cycles provided by the wait cycle counter is reached.

7. The system of claim 1, wherein the delay clock generator is present in-situ.

8. A method for generating a launch and capture clock signal, the method comprising
   generating one or more clock signals with delay with respect to a system clock, the one or more clock signals including pulses at different units of delay with respect to the system clock;
   receiving an input clock signal from one of the one or more clock signals at a counter;
   providing a plurality of registers having pre-programmed values for pulse selection;
   receiving as input at a multiplexer, the pre-programmed values from the plurality of registers and a control signal from the counter to generate a pulse selection sequence of signal values denoting a sequence in which clock signals in the one or more clock signals are to be selected over a plurality of clock cycles, the one or more clock signals being selected with a delay to create a launch pulse and a capture pulse where the launch pulse and the capture pulse change at at an edge delayed from an edge of the input clock signal, wherein signal values are used to denote different sequences in which the one or more clock signals are to be selected to generate different launch and capture clock signals; and
   generating a launch and capture clock signal based on the pulse selection sequence of signal values, the signal values identifying the clock signals over the plurality of clock cycles to create the launch pulse for a launch clock signal and the capture pulse for a capture clock signal in the launch and capture clock signal, wherein a system for generating the launch and capture clock signal is used for testing a device in which the system is located in-situ.

9. The method of claim 8, further comprising adding one or more wait cycles before the launch pulse or after the capture pulse.

10. The method of claim 8, wherein generating one or more clock signals with delay further comprises a chain of buffers to introduce the delay.

11. The method of claim 10, wherein the delay time of the chain of buffers decides the resolution of the delay for use as minimum test resolution.

12. The method of claim 8, wherein the pulse selection sequence of signal values is generated by:
   generating pre-programmed values using a boundary scan method; and
   using the pre-programmed values for pulse selection.

13. The method of claim 8, further comprising adjusting the delay at edges of each of the plurality of clocks with respect to the system clock.

14. The method of claim 13, further comprising adjusting a rising edge and a falling edge of each of the selected one or more clock signals.

15. A method for in-situ launch and capture clock generation for semiconductor device testing, the method comprising;
   generating one or more clock signals with delay with respect to a system clock, the one or more clock signals including pulses at different units of delay with respect to the system clock;
   receiving an input clock signal from one of the one or more clock signals at a counter;

providing a plurality of registers having pre-programmed values for pulse selection;

receiving as input at a multiplexer, the pre-programmed values from the plurality of registers and a control signal from the counter to generate a pulse selection sequence of signal values denoting a sequence in which clock signals in the one or more clock signals are to be selected over a plurality of clock cycles, the one or more clock signals being selected with a delay to create a launch pulse and a capture pulse where the launch pulse and the capture pulse change at an edge delayed from an edge of the input clock signal, wherein signal values are used to denote different sequences in which the one or more clock signals are to be selected to generate different launch and capture clock signals; and generating a launch and capture clock signal based on the pulse selection sequence of signal values, the signal values identifying the clock signals over the plurality of clock cycles to create the launch pulse for a launch clock signal and the capture pulse for a capture clock signal in the launch and capture clock signal, wherein a system for generating the launch and capture clock signal is used for testing the semiconductor device in which the system is located in-situ; and adding one or more wait cycles before the launch pulse and after the capture pulse.

16. The method of claim 15, wherein the semiconductor device testing comprises at least one of path delay testing, transition fault testing, and at-speed characterization.

17. A system for generating a launch and capture clock signal, the system comprising means for generating one or more clock signals with delay with respect to a system clock, the one or more clock signals including pulses at different units of delay with respect to the system clock;

means for receiving an input clock signal from one of the one or more clock signals at a counter;

means for providing a plurality of registers having pre-programmed values for pulse selection;

means for receiving as input at a multiplexer, the pre-programmed values from the plurality of registers and a control signal from the counter to generate a pulse selection sequence of signal values denoting a sequence in which clock signals in the one or more clock signals are to be selected over a plurality of clock cycles, the one or more clock signals being selected with a delay to create a launch pulse and a capture pulse where the launch pulse and the capture pulse change at an edge delayed from an edge of the input clock signal, wherein signal values are used to denote different sequences in which the one or more clock signals are to be selected to generate different launch and capture clock signals; and means for generating a launch and capture clock signal based on the pulse selection sequence of signal values, the signal values identifying the clock signals over the plurality of clock cycles to create the launch pulse for a launch clock signal and the capture pulse for a capture clock signal in the launch and capture clock signal, wherein the system for generating the launch and capture clock signal is used for testing a device in which the system is located in-situ.

\* \* \* \* \*